United States Patent [19]

Thompson

[11] 4,019,040
[45] Apr. 19, 1977

[54] CRT DISPLAY AND RECORD SYSTEM

[75] Inventor: Francis T. Thompson, Murrysville, Pa.

[73] Assignee: Westinghouse Electric Corporation, Pittsburgh, Pa.

[22] Filed: Mar. 27, 1975

[21] Appl. No.: 562,618

Related U.S. Application Data

[63] Continuation of Ser. No. 402,686, Oct. 2, 1973, abandoned, which is a continuation of Ser. No. 197,469, Nov. 10, 1971, abandoned.

[52] U.S. Cl. .................. 235/92 SH; 340/172.5; 340/168 S; 307/221 R
[51] Int. Cl.² .................................. G06F 3/14
[58] Field of Search ............ 340/172.5, 168 S; 235/92 SH; 307/221 R

[56] References Cited

UNITED STATES PATENTS

| | | | |
|---|---|---|---|
| 3,093,796 | 6/1963 | Westerfield | 328/15 |
| 3,307,169 | 2/1967 | Beck | 340/324 |
| 3,406,387 | 10/1968 | Werme | 340/324 |
| 3,585,440 | 6/1971 | Lee et al. | 315/19 |
| 3,651,511 | 3/1972 | Andrews et al. | 340/324 R |
| 3,652,999 | 3/1972 | Hjort et al. | 340/172.5 |
| 3,653,027 | 3/1972 | Scheer | 340/324 A |
| 3,662,380 | 5/1972 | Cargile | 340/347 AD |

Primary Examiner—Gareth D. Shaw
Assistant Examiner—C. T. Bartz
Attorney, Agent, or Firm—M. P. Lynch

[57] ABSTRACT

A system incorporating a cathode ray tube display device, a comparator circuit and a data recording media is utilized to continuously display measured parameters and selectively apply signals corresponding to the measured parameters for permanent recording when the measured parameters vary beyond predetermined limits. A delay type circuit is employed to provide permanent recording of signals occurring prior to the excursion of the measured parameter beyond the predetermined limits thus providing a basis for evaluating operating conditions existing prior to an unacceptable variation of a parameter beyond predetermined limits. The permanent recording of the measured parameter extends from a time prior to the occurrence of an out of limits condition, indicative of an abnormal operating condition, to a time following termination of the out of limits condition, additionally a multi-channel cathode ray tube display provides simultaneous display of individual traces representing a plurality of measured parameters wherein control circuits permit stationary display of some parameters while providing updating of information contained in other traces.

2 Claims, 19 Drawing Figures

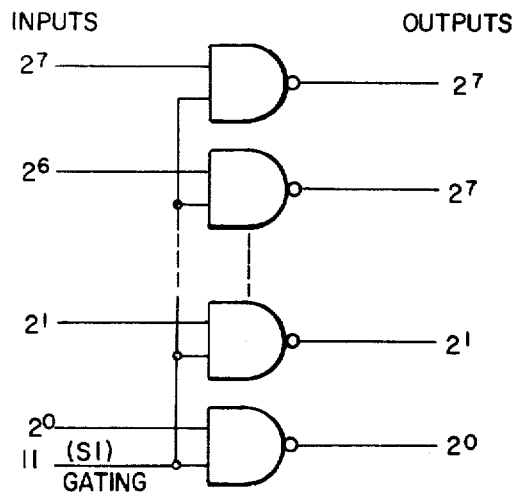
FIG. 4 NAND GATES
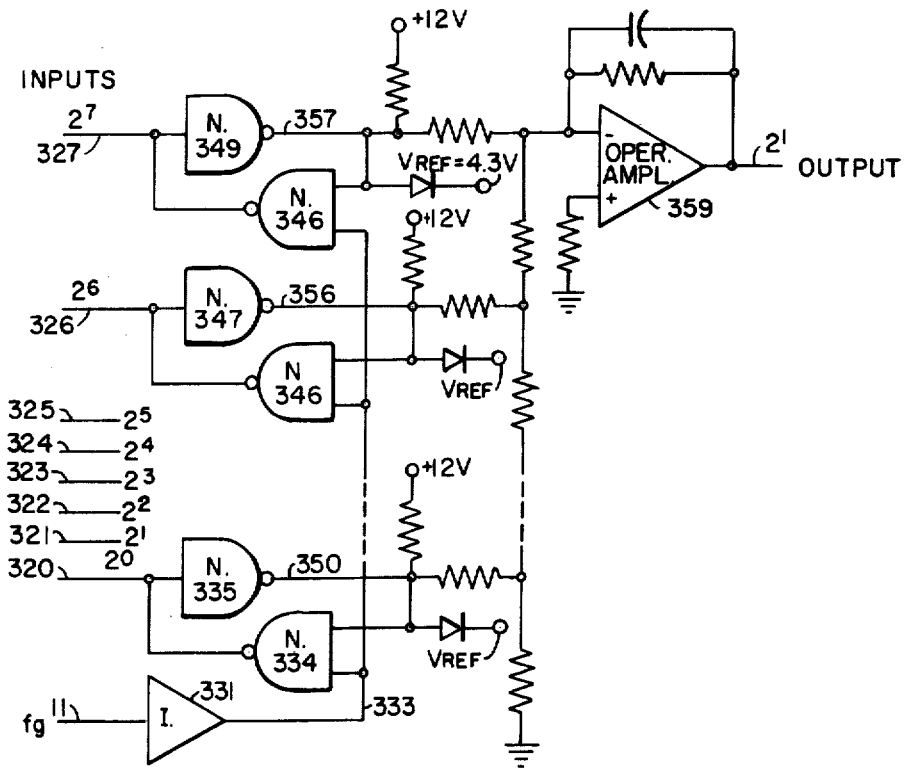
DIGITAL TO ANALOG CONVERTER
FIG. 5

FREQUENCY DIVIDER II

TREND CONTROL

TREND CONTROL WAVEFORMS

CRT DISPLAY AND RECORD SYSTEM

This application is a continuation of continuation application Ser. No. 402,686, filed Oct. 2, 1973, now abandoned, which in turn was a continuation application of application Ser. No. 197,469, filed Nov. 10, 1971 and subsequently abandoned.

BACKGROUND OF THE INVENTION

Pen recorders have been used in the past to display and record continuous signals in power plants such as temperature, voltage, power, pressure, flow load and vibration. These recorders consume large amounts of chart material and in many cases only a portion of the recording is of permanent value. In many cases the only portion of interest involves an abnormal condition such as an out of limit variable.

A cathode ray tube display which can monitor a number of variables would be useful. However, the display of signals having a long time base relative to the integration time of the human eye presents a problem. Long persistence phosphors are often used where the length of the time axis is in the order of several seconds. This type of display is not very satisfactory since only the most recent portion of the trace is well illuminated. Storage tubes have been used for displays having a long time base. They are excessively expensive and have other undesirable characteristics.

Signal time compression systems involving delay lines and shift registers have been described by Westerfield in U.S. Pat. No. 3,093,796 and Klund in U.S. Pat. No. 3,327,062. These systems involve the circulation of binary information in a shift register or delay line store. The shift register provides a convenient and inexpensive method of storing and manipulating information.

It is an object of this invention to provide a multi-channel non-fading display on an ordinary cathode ray tube or other appropriate display type monitor using information from a recirculating shift register. A further object is to provide a delayed replica of a monitored signal to a pen recorder during abnormal conditions. A further object is to permit the retention of a selected event on the cathode ray tube display. A further object is to permit the recording and display of long-term trend information. A further object is to permit the rapid transfer of said trend information to a pen recorder in order to provide a permanent record.

SUMMARY OF THE INVENTION

In the invention as described in terms of the disclosed embodiment, analog signals indicative of measured parameters are converted to binary information which is subsequently supplied to a shift register memory system. The binary information in the shift register is circulated by a shift clock signal. Each time a new piece of binary information is entered into the shift register, the oldest information in the shift register is transmitted to a digital to analog converter. The resultant analog output signal is applied to an input of a permanent data recording media, i.e., a tape recorder, a pen recorder, etc. This analog signal is a delayed replica of the intitial analog signal indicative of the measured parameter. If the original analog signal varies beyond predetermined limits the permanent recording media is activated and the delayed signals recorded thereon. Since the analog information supplied to the permanent recording media is delayed, the initial recording information will correspond to the analog signal information existing prior to the occurrence of the abnormal condition. The permanent recording media will remain activated for a predetermined period of time so as to reproduce the conditions existing prior to the abnormal condition, the conditions during the existence of the abnormal condition, and the conditions during a preselected period following the end of the abnormal condition.

The binary information contained in the shift register memory system is also available for application to the cathode ray tube display to provide a non-fading type of display of the measured parameters. This display can be utilized to provide continuous visual parameters regardless of the existence or non-existence of abnormal conditions.

Another mode of operation of the system utilizing a cathode ray tube in addition to producing a real time non-fading display, involves retention and display of long term trend information. This information may consist of various temperature, power, pressure, etc. information. A typical measured parameter may be sampled at a selected frequency so that the information contained in the shift register and displayed on the cathode ray tube screen contains information representing that measured parameter for an extended period of time, i.e, 24 hours.

The invention will become more readily apparent from the following exemplary description in connection with the accompanying drawings.

DESCRIPTION OF THE DRAWINGS

FIG. 4 is a logic diagram illustrating a NAND gate arrangement embodied in FIG. 1;

FIG. 5 is the block diagram schematic digital-to-analog converter embodied in FIG. 1;

FIG. 10b is a waveform illustration of the operation of the trend control circuit of FIG. 10a;

DESCRIPTION OF THE PREFERRED EMBODIMENT

Figure 1:
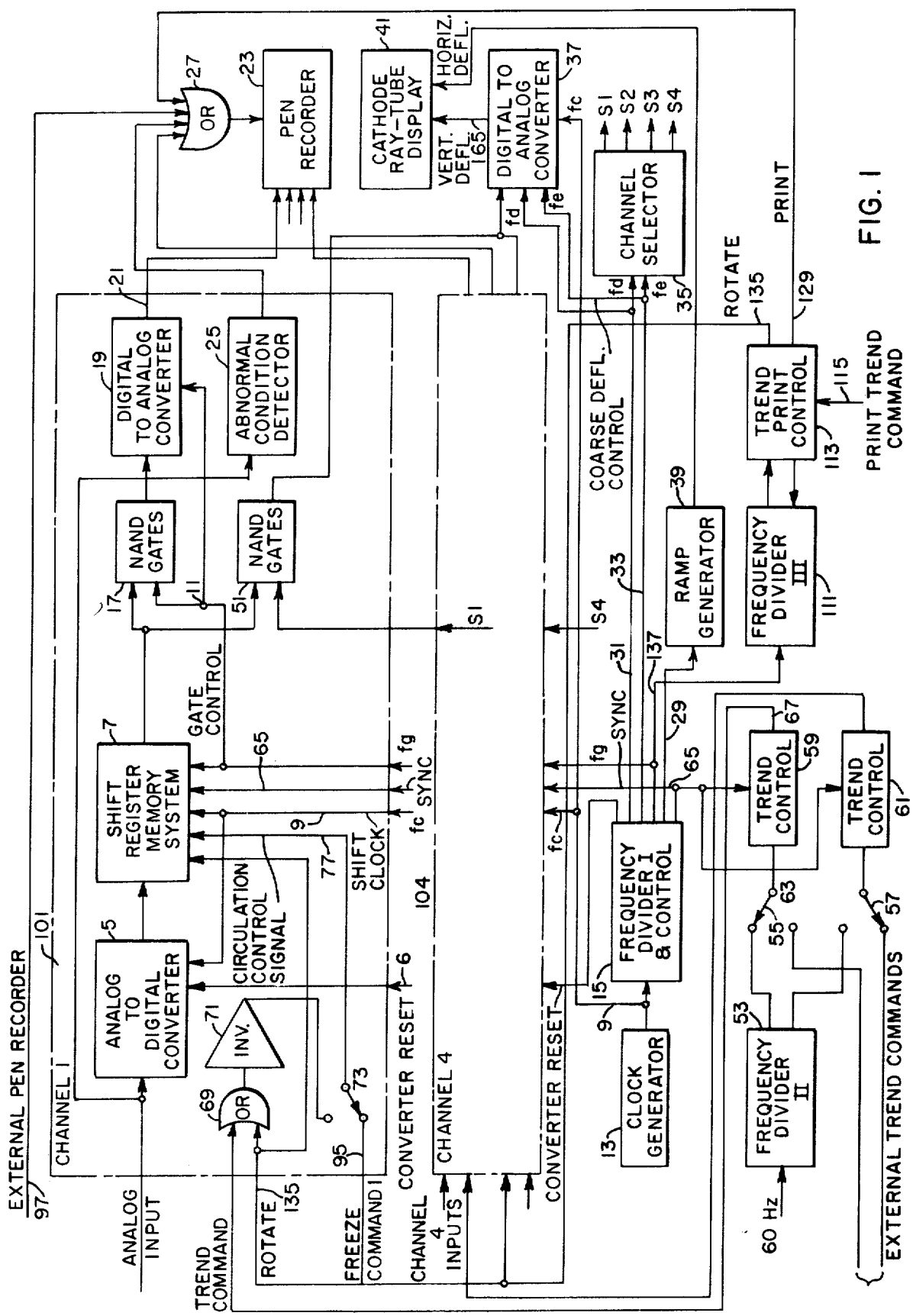
FIG. 1 is a block diagram schematically illustrating multi-channel systems including a permanent recording means and a cathode ray tube display device for monitoring and recording individual measured parameters on each of said channels.

Referring to FIG. 1 there is illustrated an embodiment of the invention comprising a multichannel monitoring system capable of simultaneously displaying 4 separate analog input signals on a cathode ray tube display 41 while recording on pen recorder 23 analog input signals indicative of abnormal operation of a facility such as nuclear reactor, a process control system, etc. In addition to real time display and recording the multi-channel monitoring system provides for the display of long term trend signals on the cathode ray tube display 41 as well as means for rapidly transferring the trend information, being shown on the cathode ray display, to the pen recorder 23 to provide a permanent record.

Each of the 4 analog input signals 1–4 is applied to a separate channel 101–104 as shown in FIG. 1. Inasmuch as each channel is identical in structure and operation, the discussion will be limited to the components and operation of channel 101. Analog input signal 1 is applied to an analog-to-digital converter 5 of the type illustrated in FIG. 2, where it is sampled and converted into a binary number. This number is applied to shift register memory system 7 which is illustrated schematically in FIG. 3. Each of the binary bits representing this number is gated into the shift register memory 7 at a sampling rate $f_o$ under the control of gate control signal 11 having a frequency $f_o$. The information in the shift register is circulated by shift clock signal 9 which has a frequency $f_c$. Frequency $f_c$ is generated by clock generator 13, which may be embodied using any one of several types of oscillators. Frequency $f_o$ is obtained by dividing frequency $f_c$ by a factor $m$ as controlled by a frequency divider 15 of the type illustrated in FIG. 7. The effect of the relationship between these frequencies is discussed in the above referenced U.S. Pat. No. 3,093,796. In the embodiment being described, $m$ is chosen equal to an ± 1 where $a$ is the number of circulations of a bit between samples and $n$ represents the number of bit positions in the shift register. Assuming $a$ = 2 and $n$ = 512 the information entered into the shift register would circulate through the $n$ bit shift register 2 times and advances one additional location in the shift register before the $f_o$ signal samples the next output of the analog-to-digital converter 5. The next signal from the analog-to-digital converter 5 is entered into the shift register adjacent to the previous sample. Each time a new piece of information is entered into the shift register, the oldest information in the shift register is discarded. A typical sampling rate of input signals is in the range of 1–1000 signals/sec.

The NAND gates 17 of FIG. 1 are controlled by the gating signal 11 illustrated in FIG. 4. NAND gates 17 are opened in coincidence with the sampling of a new piece of information and pass the oldest information being discarded from the shift register memory system 7 to a digital-to-analog converter 19 of the type illustrated in FIG. 5. The analog output signal 21 from the digital-to-analog converter 19 is applied to one of the analog inputs of pen recorder 23. Analog signal 21 is a delayed replica of the analog input signal 1. The delay is equal to $n$ times the period of frequency $f_o$, where $f_o$ is the sampling rate. In one particular embodiment, $m$ = 1025, $n$ = 512, $f_c$ = 123 kHz, and $f_o$ = 120 Hz. In this case, a delay of 4.27 seconds is obtained. If analog input signal 1 exceeds a specified voltage level, thereby indicating an abnormal condition, abnormal condition detector 25 produces a ONE output which passes through OR gate 27 and turns on the motor drive of pen recorder 23. Since the analog information fed to the pen recorder is delayed, the initial recorded information will correspond to the information applied to analog input 1 prior to the occurrence of the abnormal condition. The output of detector 25 is retained as a ONE until a specified time following the end of the abnormal condition. The pen recorder 26 therefore reproduces the analog input signals preceding the abnormal condition, the analog input signals during the abnormal condition, and the analog input signals during a pre-selected period following the end of the abnormal condition.

Figure 8A:
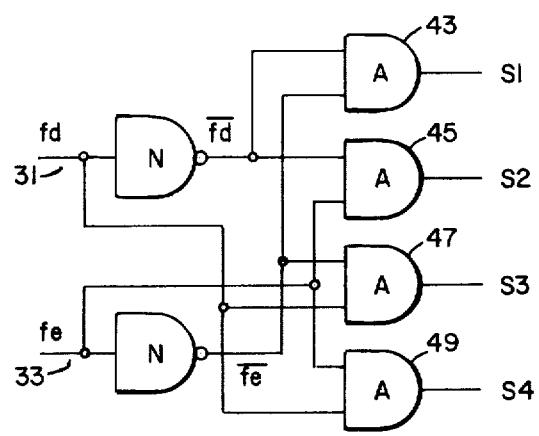
FIG. 8a is a schematic illustration of a channel selector circuit embodied in FIG. 1.
Figure 8B:
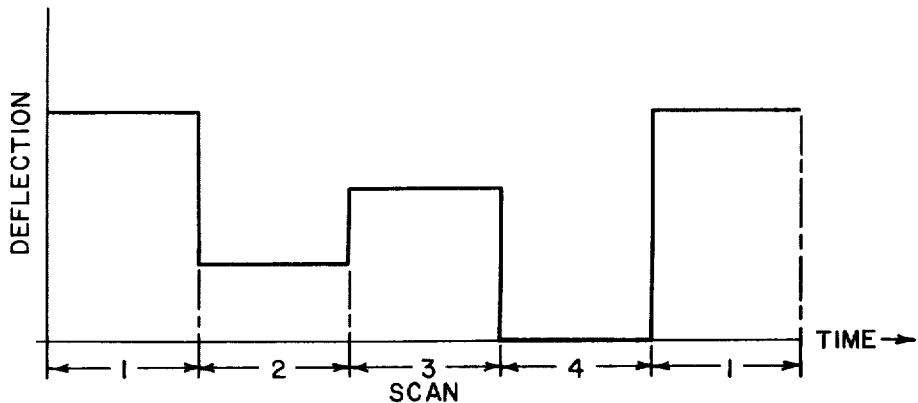
FIGS. 8b and 8c are waveform illustrations of the operation of the cathode ray tube device embodied in FIG. 1.
Figure 8C:
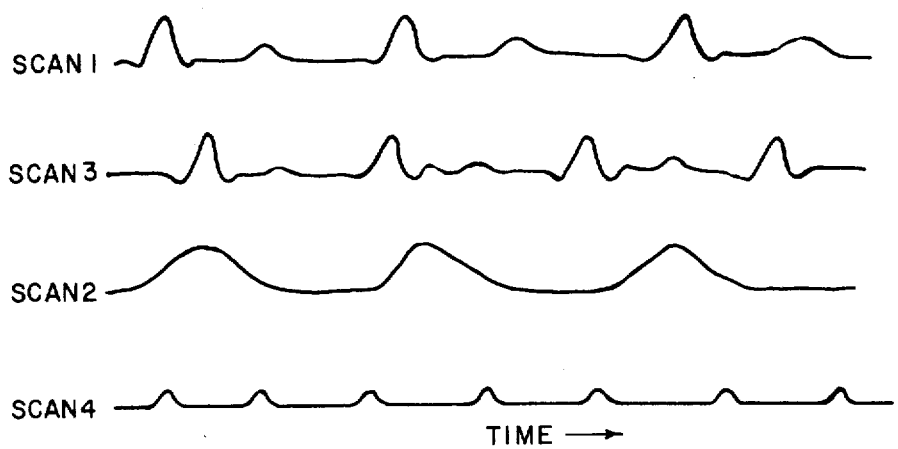

In addition to selectively printing out analog information in response to abnormal operating conditions the information contained in the shift register memory systems 7 of channels 101, 102, 103 and 104 can be used to provide a non-fading type of display on the cathode ray tube display 41 as shown in FIG. 8c. In order to display the 4 waveforms rapidly, so that the human observers does not perceive any flicker, the horizontal deflection rate of the cathode ray tube display is controlled by a ramp generator control signal 29 from the frequency divider 15 is selected in this embodiment as 240 Hz. This signal is applied to a standard type of ramp generator 39 to produce a triangular waveform at this repetition rate. The output of ramp generator 39 controls the horizontal deflection of cathode ray tube display 41. Square wave signals 31 and 33, having frequencies $f_d$ and $f_e$ respectively equal to 120 Hz and 60 Hz, are derived from frequency divider 15 and applied to the channel selector circuit 35 which is illustrated in FIG. 8a, and also are applied to digital-to-analog converter 37.

While a specific set of operating conditions have been established for the purpose of describing the invention, it is noted that these conditions are merely illustrative. Typical ranges of values for frequencies corresponding to $f_o$, $f_c$ display repetition rate and horizontal deflection rate are:

$f_o$ . . . 1 – 1000 Hz
$f_c$ . . . 10 kHz – 10 MHz
Display repetition rate . . . greater than 30 Hz
Horizontal deflection rate . . . 30 – 500 Hz Signals 31 and 33 are applied to the two most significant bits of digital-to-analog converter 37 so as to provide the coarse vertical deflection waveform shown in FIG. 8b. If no signals are applied to any of the analog inputs, the coarse vertical deflection waveform will cause four straight-line traces to appear on the cathode ray tube display 41. A typical 4-channel display is shown in FIG. 8c. The order of selecting the 4 scanned traces was selected to minimize the undesirable effect known as line crawl.

The signals 31 and 33 are also applied to the channel selector circuit 35. Referring to FIG. 8a, the four possible combinations determined by signals 31 and 33 are generated by AND gates 43, 45, 47 and 49 to produce channel select signals S1 through S4 respectively. Channel select signal S1 is applied to NAND gates 51 of channel 1. Similarly, signals S2, S3 and S4 are applied to channels 2, 3 and 4 respectively. One and only one of these signals is in the ONE state at any given time, thereby enabling the NAND gates 51 of one particular channel. NAND gates 51 like NAND gates 17 are schematically illustrated in FIG. 4, and the S1, S2, S3 or S4 signal is connected to the select input in place of signal 11.

The outputs of NAND gates 51 are connected to digital-to-analog converter 37 which is comparable to the digital-to-analog converter illustrated in FIG. 5. Two additional stages, identical to those shown for bits $2^0$ through $2^7$, are used in the digital-to-analog converter 37 and are placed in the locations corresponding to $2^8$ and $2^9$. These bits are driven by signals 31 and 33 to produce the coarse vertical deflection waveform described above. The output of digital-to-analog converter 37 produces an analog voltage waveform which is used to control the vertical deflection of the cathode ray tube display 41.

Figure 9:
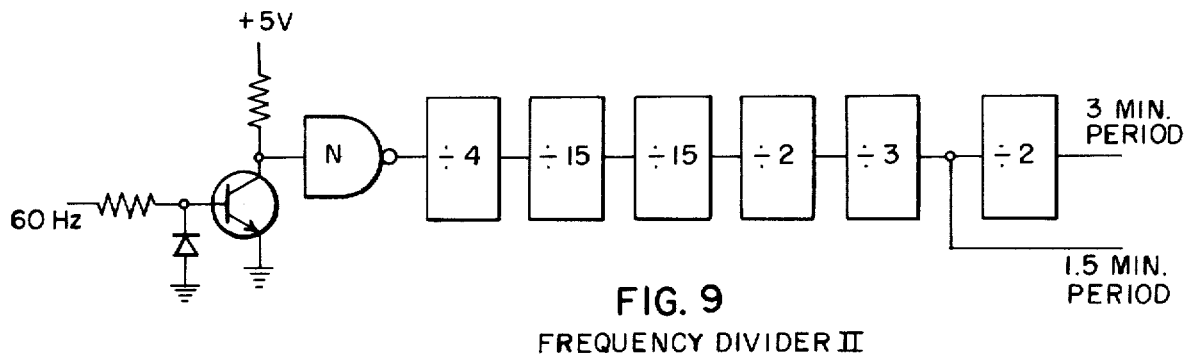
FIG. 9 is a schematic illustration of a frequency divider circuit embodied in FIG. 1.
Figure 10A:
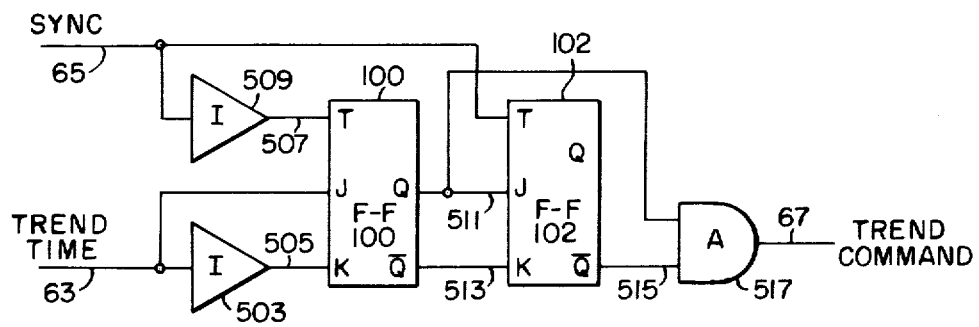
FIG. 10a is a schematic illustration of a trend control circuit embodied in FIG. 1.

The above description has described the use of the shift register memory system 7 to produce a real time non-fading display. The analog input information was sampled at a frequency $f_g$ which in a particular embodiment was selected as 120 Hz. It is often desirable to retain and display long-term trend information. This information may consist of various temperature, power, and pressure signals. A typical signal might be sampled once every 3 minutes so that the information contained in the 512 bit shift register and displayed on the cathode ray tube screen would contain information representing that variable for approximately the past 24 hours. To obtain the timing for the trend sampling command, the 60 Hz power line frequency is fed to a frequency divider 53 which is schematically illustrated in FIG. 9. Other timing outputs can be obtained from this divider by tapping off other divider stages. The output from frequency divider 53 may be selected by switches 55 and 57 which apply these signals to one of the trend control circuits 59 or 61. Alternately, switches 55 or 57 can select external trend commands which could be generated by a digital computer. It is to be noted that the timing of the trend commands need not be related to the timing in frequency divider 15. Proper timing of the trend sampling function is determined by the trend control circuit 59 which is schematically illustrated in FIG. 10a. Input signal 63 to trend control circuit 59 determines the approximate period during which a trend sample is to be taken. The exact sampling time within this approximate period is determined by sync signal 65 which is generated by the frequency divider 15.

During the majority of the time when operating in the trend mode, the information in the shift register memory system circulates through $2n + 1$ shift register bits during the $m = 2n + 1$ counting period of frequency divider 15. As a result, the shift register information remains in the same location at the end of each circulation period. This results in the information remaining stationary on the cathode ray display screen.

When it is desired to sample a trend data point, the output signal 67 from the trend control circuit 59 produces a ONE output which passes through OR gate 69 in the channel 101 and is inverted by inverter 71 to produce a ZERO signal. When operating in the trend mode, switch 73 in channel 101 is in the upper position and conducts the ZERO signal to the circulation control input 77 of shift register memory system 7.

Figure 3:
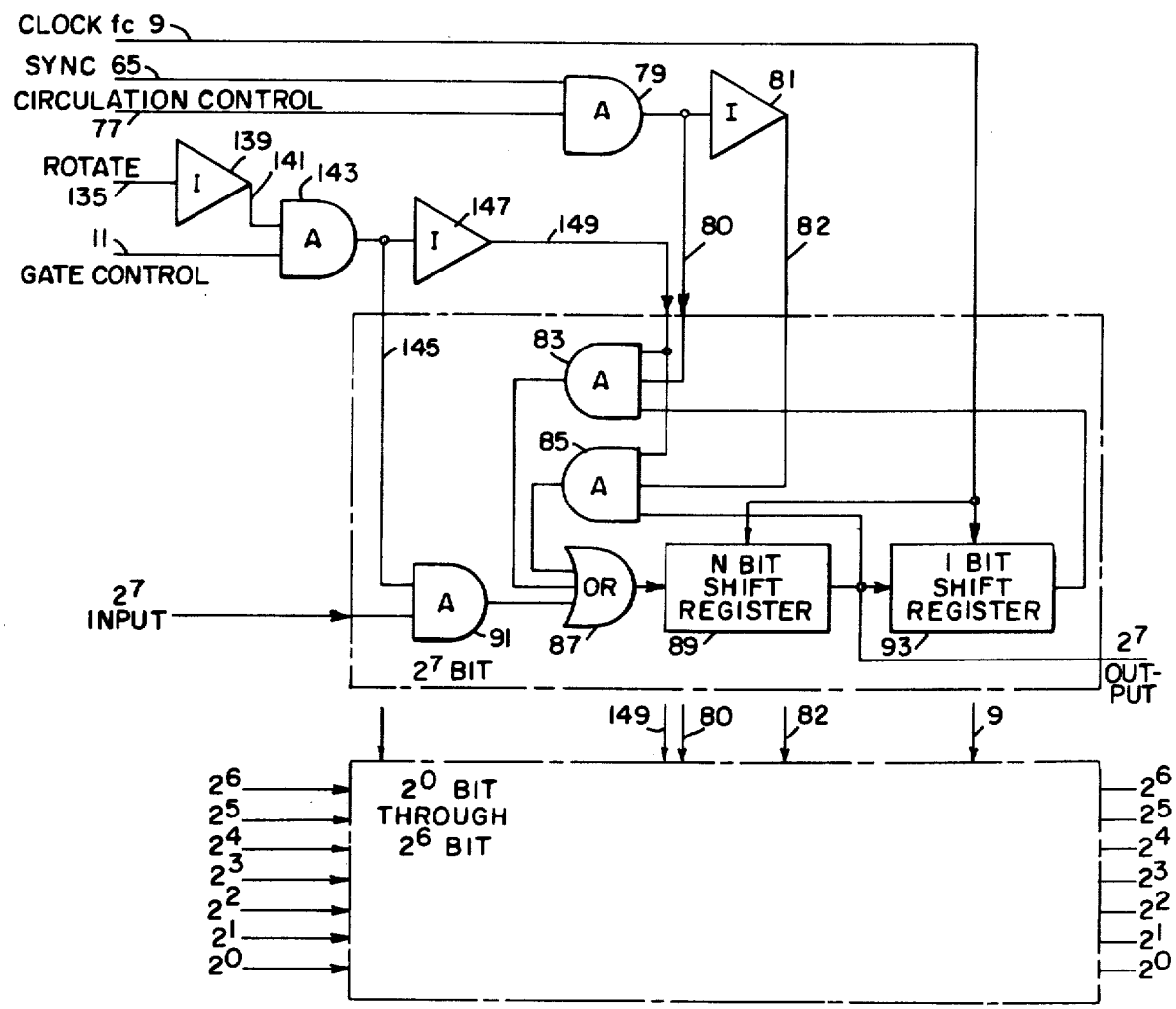
FIG. 3 is a block diagram schematic of a shift register memory system embodied in FIG. 1.

Referring to FIG. 3, the ZERO input signal on input 77 results in a ZERO output signal from AND gate 79 and a ONE output signal from inverter 81. This causes AND gate 85 which closes the circulation path through OR gate 87 and $n$ bit shift register 89. The shorter circulation path of only $n$ bits results in a net shifting by one bit of all the information in the shift register during the circulation period of $2n + 1$ counts. The signal 67 from the trend control circuit 59, which shortened the circulation path, is effective during only a single circulation period. During this period, all information in the shift register advances by one location and the newly sampled trend information is entered into the shift register system through analog-to-digital converter 5, AND gates 91 and OR gates 87 into the shift register 89. During subsequent periods and prior to the next trend sample, the trend command signal 67 returns to a ZERO which acts through OR gate 69, inverter 71 and switch 73 to provide a ONE input to input 77 of the shift register memory system 7. This signal operating on AND gate 79 in conjunction with sync signal 65 from frequency divider 15 produces an alternating ONE and ZERO output from AND gate 79 which is in phase with sync signal 65. The output of inverter 81 is the complement of signal 79. These signals act on AND gates 83 and 85 so as to alternately enable one of them and close the other. During a single circulation period, AND gate 83 is enabled during 512 consecutive clock pulses and AND gate 85 is enabled for the remaining 513 consecutive pulses. This results in a bit of information in the shift register being circulated once through an $n$ bit shift register path and once through an $n + 1$ bit shift register path for a total of $2n + 1$ bits. This results in a stationary display as previously described.

The shift register memory 7 illustrated in FIG. 3 consists of a plurality of identical bit stages for $2^0$, $2^1$, $2^2$, $2^3$, $2^4$, $2^5$, $2^6$ and $2^7$. The $2^7$ stage is illustrated in detail. It is apparent that this parallel connected arrangement of stages can be replaced by a single stage of equal number of bit positions on a combination of a group of parallel stages with one or more series stages.

When operating in the normal real time mode, the input signal 77 is normally a ZERO which results in a slowly moving display on the cathode ray tube and the sampling of any information at a rate determined by frequency $f_g$. For the frequencies given above, a new piece of information appears at the right hand side of cathode ray tube display 41 and moves slowly towards the left side and disappears from the screen. This corresponds to the discarding of this information from the shift register 7. For the values given it takes 4.27 seconds for the information to move across the cathode ray tube screen.

If it is desired to retain displayed information on the screen for further evaluation, a freeze signal can be introduced by the application of a logic ONE to switch 73. If a ONE freeze command signal 95 is applied to signal 1 when operating in the normal real time mode, it passes through switch 73 and is applied as signal 77 to the shift register memory system 7. As described previously, a ONE input signal 77 results in a stationary display. By applying this freeze signal, the present information in the shift register is retained and appears as a stationary display on the cathode ray tube.

This information may be printed out on the chart recorder, by applying a ONE input signal to the external pen recorder command input 97 and removing the ONE freeze command signal 95. This will permit new information to be entered into the shift register and the information presently in the shift register to be printed out on the pen recorder.

Figure 11:
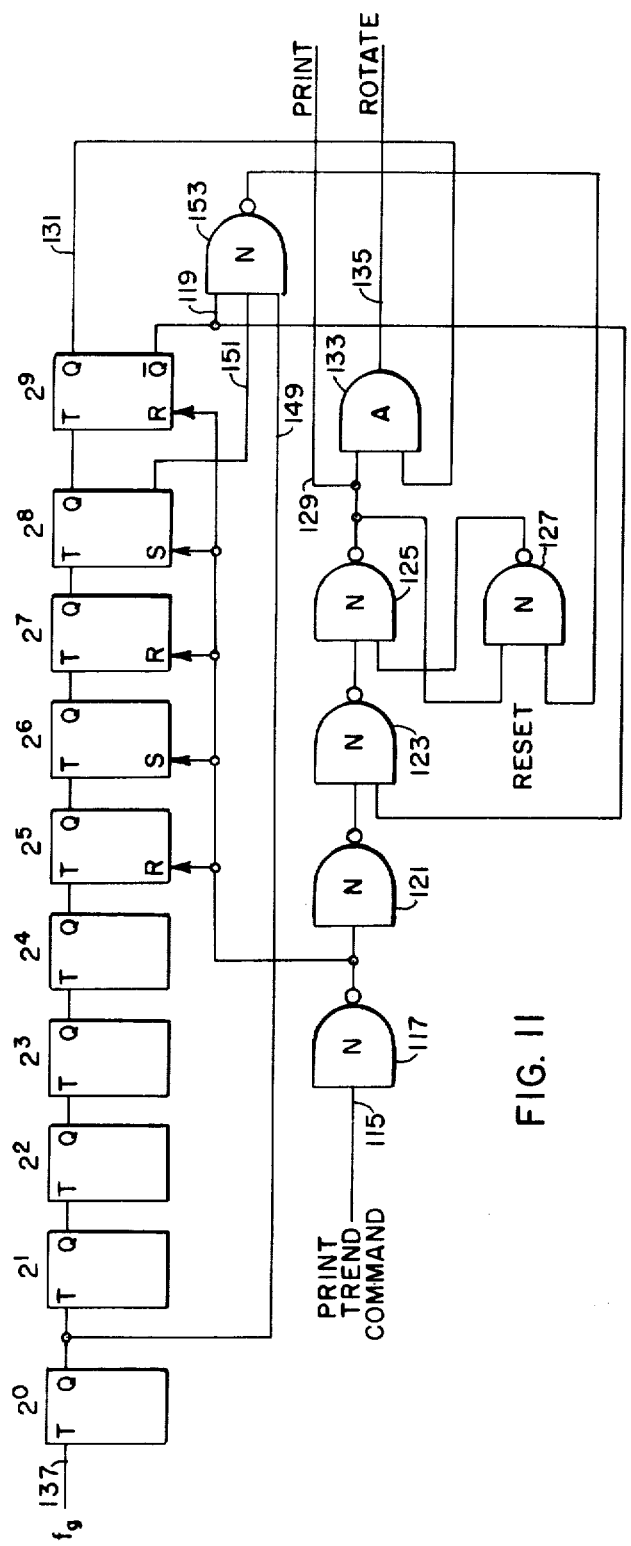
FIG. 11 is a schematic illustration of yet another frequency divider circuit in combination with a trend print control circuit.

When operating in the trend mode, the printing out of information on the pen recorder is considerably more difficult. The information stored in shift register memory system 7 and displayed on cathode ray tube display 41 may represent over 24 hours of input data rather than the 4.27 seconds of data when operating in the real time mode. Furthermore, it is imperative that this 24-hour information is not lost in the process of transferring it to the pen recorder. Furthermore, it is desirable to achieve the transfer of this information in a reasonably short time. It is the function of frequency divider 111 and trend print control 113 to accomplish the desired transfer without loss or permanent displacement of the stored trend information in a time corresponding to the transer of real time information, e.g. 4.27 seconds. When a ONE signal is applied to print trend command 115 of trend print control 113 as illustrated in FIG. 11, it is inverted by NAND gate 117 and applied to certain stages of frequency divider 111 as illustrated in FIG. 11. In this particular embodiment the $2^5$, $2^7$ and $2^9$ stages of frequency divider 111 are reset, and the $2^6$ and $2^8$ stages are set by the ZERO signal from NAND gate 117. This causes the count in frequency divider 111 to be held between 320 and 352 as long as the print trend command signal 115 remains a ONE. Since the $2^9$ stage is held in the reset condition, its $\overline{Q}$ output 119 is a ONE. The output of NAND gate 121 is also a ONE when input signal 115 is a ONE. This results in a ZERO signal from NAND gate 123 which causes the flip-flop, consisting of NAND gates 125 and 127, to be placed in the set state with the output signal 129 of NAND gate 125 being a ONE. Signal 129 is applied through OR gate 27 to start the pen recorder.

The Q output 131 of the $2^9$ stage of frequency divider 111 remains a ZERO as long as the print trend command signal 115 remains a ONE. The ZERO signal 131 is applied to AND gate 133 causing its output 135 to remain in the ZERO state. During this time the output 21 of digital-to-analog converter 19 remains at a constant value corresponding to the information in a given location in the shift register and pen recorder 23 produces a straight line. When the print trend command signal 115 is returned to its normal ZERO state, the output of NAND gate 117 becomes a ONE, thereby enabling frequency divider 111 to resume normal counting from its present state. The counter 111 is driven by signal 137 which has a frequency $f_g$ corresponding to the gating frequency applied to NAND gates 17. The frequency divider 111 will continue counting as determined by input signal 137. When the frequency divider reaches a count of 512, signal 131 from the $2^9$ stage will become a ONE which will cause rotate signal 135 to become a ONE. Signal 135 is applied to OR gate 69 of FIG. 1 and is inverted by inverter 71 to produce a ZERO signal which is applied through switch 73 as input signal 77 to the shift register memory system. This signal causes the shift register information to circulate through the n bit shift register 89 and therefore to advance in position at the same rate as in the real time mode. During this time the ONE rotate signal 135 is also applied directly to the shift register memory system 7 as detailed in FIG. 3 where it is inverted by inverter 139 to obtain a ZERO signal 141 which blocks AND gate 143, thereby providing a ZERO signal 145 to AND gates 91 which prevents new information from being applied from the analog inputs to the shift register memory system 7. Signal 145 is also applied to inverter 147 to ensure that a ONE signal remains on lead 149 independent of gate control signal 11. This ensures that all shift register information circulates through AND gate 85 and that no information is discarded. Gate control signal 11 operates on NAND gates 17 in the normal manner to provide one sample of shift register information per the $2n + 1$ circulation period to digital-to-analog converter 19. These conditions persists for exactly 512 $f_g$ pulses which results in printing out all of the information contained in the shift register onto the pen recorder chart during a period of 4.27 seconds. Since the shift register information moves by one location for each $f_g$ pulse, these 512 $f_g$ pulses leave the shift register information in its original position in the 512 bit shift register 89. The 512 pulse period is controlled by frequency divider 111 since signal 131 from the $2^9$ stage remains a ONE for exactly 512 pulses. At the end of 512 pulses, signal 131 becomes a ZERO which acts through AND gate 133 to make rotate signal 135 become a ZERO. Signal 135 causes the shift register memory system to return to its normal trend condition in which the information remains stationary except during a trend sample.

The transition of signal 131 from a ONE to a ZERO occurs when the count of frequency divider 111 changes from 1023 to 0. The next $f_g$ pulse changes the counter to a 1 count at which time signals 119, 151 and 149 are all in the ONE state. This causes NAND gate 153 to produce a ZERO signal output which resets flip-flop 125–127 and produces a ZERO output on lead 129. The ZERO signal on lead 129 causes the pen recorder 23 to stop, thereby completing the printout of trend information.

Figure 12:
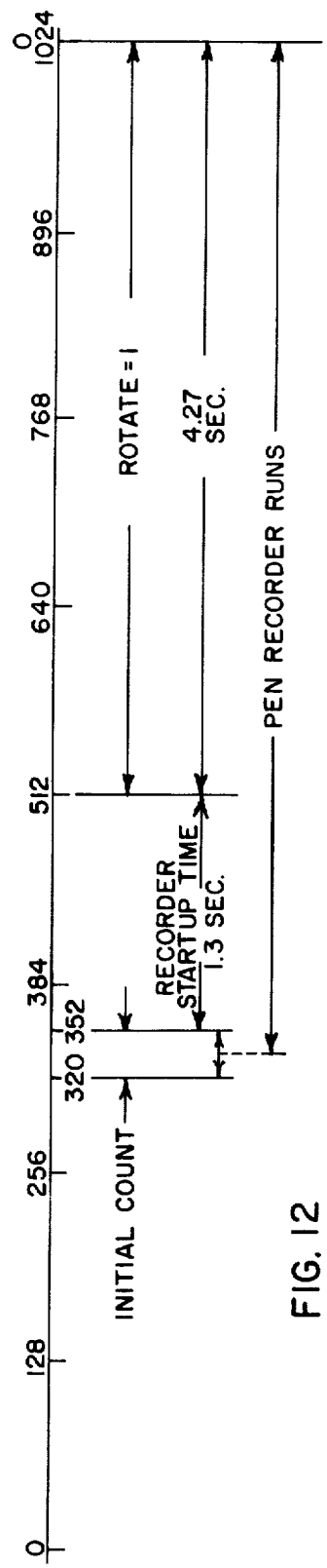
FIG. 12 is a timing diagram illustrating the operation of the frequency divider circuit illustrated in FIG. 11.

The timing diagram relating the count of frequency divider 111 to signals 129 and 135 during the print out of trend information is shown in FIG. 12.

Figures 13, 14:
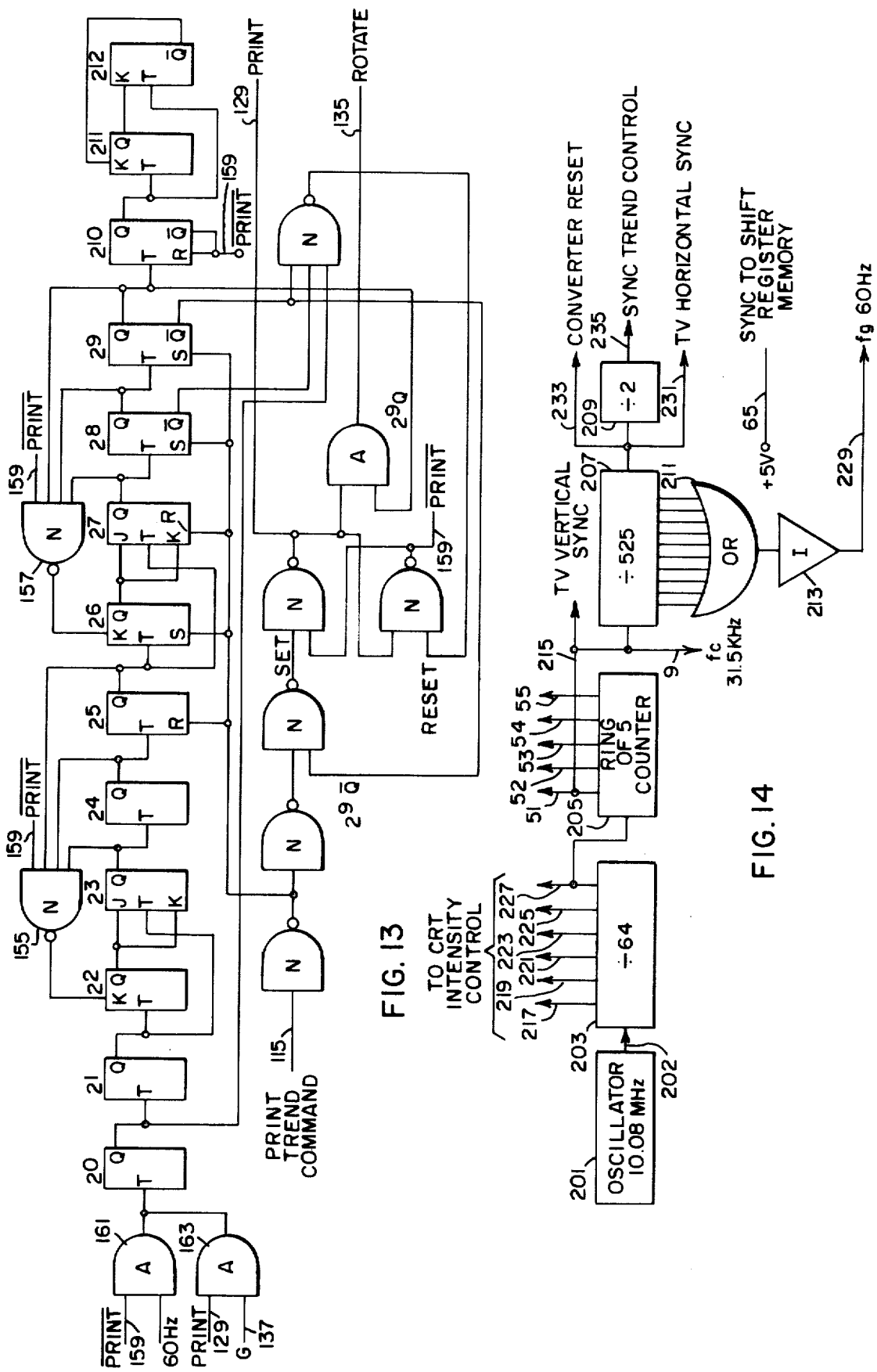
FIG. 13 is a schematic illustration of a combination of the frequency divider circuit and trend print control circuit of FIG. 11 with the frequency divider circuit of FIG. 9.
FIG. 14 is a schematic illustration of a modification to the embodiment of FIG. 1 for display of information and a cathode ray tube in a manner similar to that utilized in conventional television.

For reasons of economy, the hardware used in frequency divider 53 and frequency divider 111 can be combined as shown in FIG. 13. NAND gates 155 are used in the frequency divider to provide a feedback path to permit 4 binary stages of the frequency divider to function as a divide-by-15 stage as required in frequency divider 53. NAND gate 157 permits another 4 binary stages to be used to divide-by-15. Signal 159 which is the complement of signal 129 is applied to NAND gates 155 and 157 to disable them during the transfer of trend information to the pen recorder, i.e. signal 129 equals ONE. This causes the divider chain of FIG. 13 to function as a binary counter indentically to frequency divider 111. AND gates 161 and 163 are controlled by signals 159 and 129 respectively to apply the appropriate input to the frequency divider chain, namely the 60 Hz input or signal 137 respectively. The stages following the $2^9$ stage are disabled during the time that signal 129 is a ONE by the application of signal 159 to the J and K inputs of the $2^{10}$ stage. Thus the most significant bits, $2^{10}$, $2^{11}$ and $2^{12}$, are not affected by the transfer of trend information to the pen recorder. This minimizes the disturbance to the trend sampling timing period.

The above embodiment has been described as an oscilloscope-type of display in which the waveform on the cathode ray tube is obtained by deflecting the vertical amplifier in proportion to the amplitude of the analog signal to be reproduced. An alternate type of display can be obtained by applying saw-tooth deflection to the cathode ray tube trace over a considerable portion of the cathode ray tube height at a high frequency vertical rate and turning on the beam of the cathode ray tube when it is desired to reproduce a data point. Horizontal saw-tooth deflection is simultaneously applied to the cathode ray tube trace at a lower frequency, e.g. 60 Hz. This method of reproduction is similar to that used in conventional television with the orientation of the cathode ray tube rotated by 90°. While a non-interlaced raster is described herein, the conventional interlace raster system as described in U.S. patent application Ser. No. 088916 filed by Dennis A. Stonelake on June 22, 1971 may also be used. In the present embodiment, clock generator 13, channel selector 35 and frequency divider and control 15 of FIG. 1 are replaced by the oscillator 201, counter 203, counter 205, counter 207, counter 209, gate 211, and inverter 213, as shown in FIG. 14. Digital-to-analog converter 37 is eliminated since the vertical deflection signal 165 is no longer required. Instead, the vertical deflection is controlled by vertical sync signal 215 from counter 205.

Figure 15:
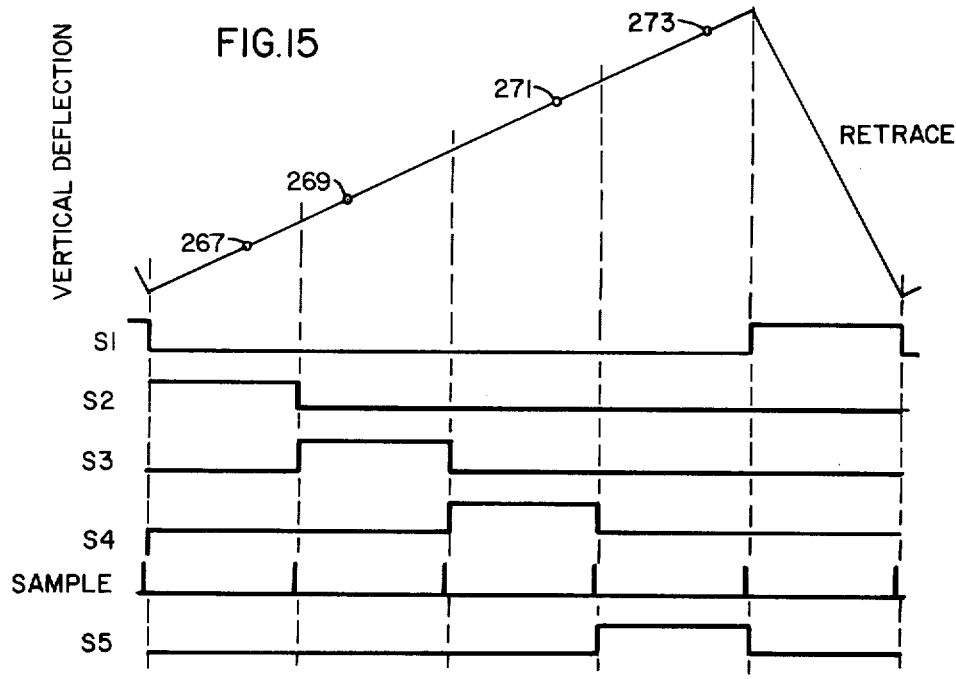
FIG. 15 is a timing diagram for the intensity control circuit of FIG. 14.

Oscillator 201 provides a 10.08 MHz output 202 to a 6-stage binary counter 203. The outputs of these 6 stages are 217, 219, 221, 223, 225 and 227, corresponding to weights $2^0, 2^1, 2^2, 2^3, 2^4$ and $2^5$ respectively. Signal 227 is applied to a ring-of-five counter 205. This counter produces a ONE output from only one of its 5 outputs, S1, S2, S3, S4, S5 at any given time. The sequence of these signals is shown in FIG. 15. Signal S1 is identical with sync signal 215 which is also used as shift clock signal 9 having a frequency $f_c$ equal to 31.5 kHz. Signal 215 is also applied to frequency divider 207 which divides by 525. When the outputs of all the stages of this counter are in the ZERO state, corresponding to a count of 0, OR gate 211 produces a ZERO output which is inverted by inverter 213 to produce a ONE output pulse on lead 229 at a repetition rate $f_o$ of 60 Hz. In this embodiment the signal from lead 229 provides the gate control signal 11 and therefore the information is sampled at a rate of 60 Hz. Output 231 of frequency divider 207 is used to synchronize the horizontal deflection of cathode ray tube display 41. This output of frequency divider 207 is also applied to lead 233 which is connected to analog-to-digital converter 5 to provide for resetting of the counter and ramp. This output from divider 207 also feeds a divide-by-2 circuit 209 to produce a signal 235 which is connected to the sync input of trend control 59 in place of sync signal 65.

In this embodiment shift register 89 of shift register memory system 7 contains and equals 524 bits and a gating pulse $f_o$ occurs once every circulation cycle, corresponding to 525 $f_c$ pulses. In this embodiment sync signal 65 to AND gate 79 of shift register memory system 7 is permanently a ONE and therefore is shown orginating from the positive power supply in FIG. 14.

Figure 16:
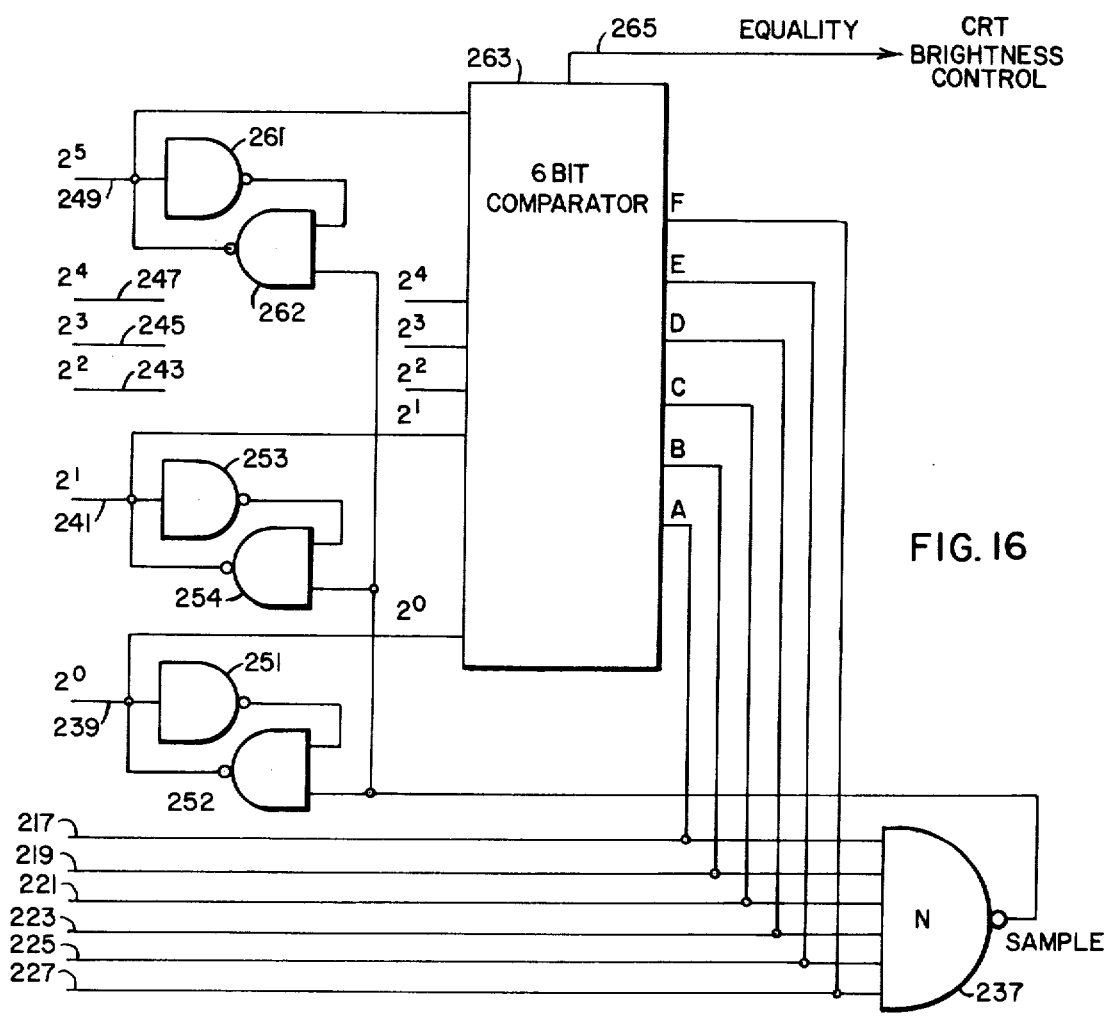
FIG. 16 is a schematic illustration of a cathode ray tube intensity control circuit in combination with the circuitry of FIG. 15.

Considering the timing diagram of FIG. 15, signal S1 causes the vertical deflection of cathode ray tube display 41 to retrace to the bottom edge of the tube. Signal S1 is applied to NAND gates 51 of channel 1 and permits the output of the shift register memory system to be connected to inputs 239, 241, 243, 245, 247 and 249 of the cathode ray tube intensity control of FIG. 16. Just prior to the end of the retrace period, counter 203 is at count 63, corresponding to a ONE signal on each of the outputs 217, 219, 221, 223, 225 and 227. These signals are applied to NAND gate 237 of the cathode ray tube intensity control shown in FIG. 16. When all these signals are in the ONE state, the NAND gate 237 produces a ZERO output which causes the information from NAND gates 51, which is applied to inputs 239, 241, 243, 245, 247 and 249 of the cathode ray tube intensity control, to be sampled by the flip-flops embodied by NAND gates, 251 through 262. The binary number stored in these flip-flops is proportional to the amplitude of the signal to be displayed on the cathode ray tube display and is retained during the first quarter of the vertical deflection waveform shown in FIG. 15. Following count 63 of counter 203, the count becomes 0 which causes the ring-of-five counter 205 to change state such that signal S2 is a ONE. The output of counter 203 is also applied to the 6-bit comparator 263 of the intensity control such that the least significant bit output 217 from the counter is compared with the $2^0$ output provided by flip-flop 251-252. During the first portion of the vertical deflection occurring while signal 32 is in the ONE state, counter 203 will count up toward its maximum count of 63. At the time when its count corresponds to the number stored in flip-flops 251-262, an equality signal 265 will be obtained from the comparator. This equality signal is applied to cathode ray tube display 41 so as to produce a high intensity spot corresponding to point 267 shown in FIG. 16. Similarly, at count 63 when S2 is a ONE, a ZERO output is provided by gate 237 to transfer the information from channel 2 to flip-flops 251-262. During the subsequent period while S3 is a ONE, an equality signal 265 will be produced when the count of counter 203 corresponds to the information stored in the flip-flops. This will produce a bright spot illustrated as a point 269 on the diagram of FIG. 15. Similarly, spots 271 and 273 are produced as determined by the information in channels 3 and 4 respectively.

The constants are chosen in this system so that each of the 525 vertical scanning lines of the television-type display corresponds to one information point in the $n + 1 = 525$ bit total shift register length. When the shift register information circulates through AND gate 85 it passes through only $n$ bits and therefore advances one shift register location per circulation. The information for line 1 of the display occupies the shift register location adjacent to the information for line 2. Since the display for the constants chosen is non-interlaced, i.e., line 1 is scanned, then line 2, then line 3, etc., the information is read out through NAND gates 51 in the corresponding sequential order.

DETAIL CIRCUIT OPERATION

Figure 2:
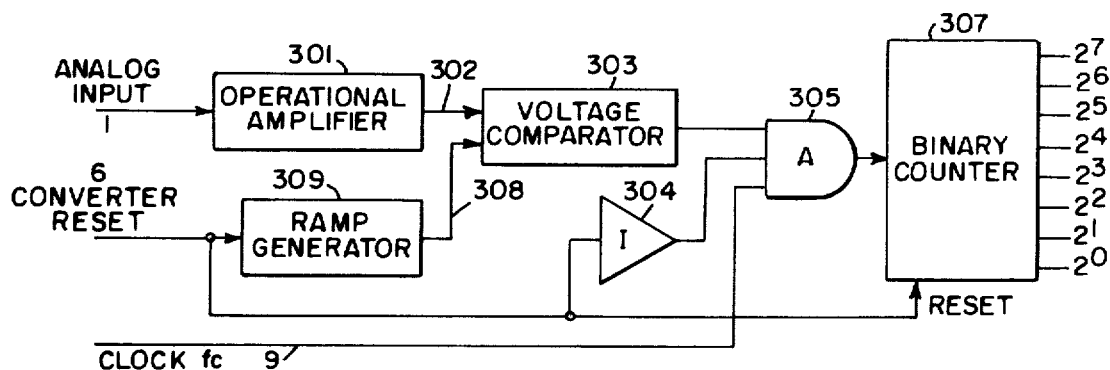
FIG. 2 is a block diagram schematic analog-to-digital converter embodied in FIG. 1.

The analog-to-digital converter 5 of FIG. 2 functions in the following manner. The analog input 1 is applied to an operational amplifer 301 which amplifies the signal so as to provide an output voltage range of 0 to 2.8 volts. The ramp generator, which is controlled by the converter reset signal 6, produces a triangular ramp waveform from 0 to 3 volts at a repetition rate equal to the sampling rate $f_o$. The AND gate 305, under the control of voltage comparator 303, passes clock pulses from input 9 to the binary counter 307 during the period that the operational amplifier output voltage 302 exceeds the output voltage 308 of the ramp generator 309. Therefore, the count stored in the binary counter at the end of the ramp period is proportional to the amplitude of the analog input 1. Following the counting period, the binary count 307 remains fixed until the end of the cycle, at which time the counter is reset by signal 6. The converter reset signal 6 then resets the ramp to 0 volts and the cycle is repeated. This reset signal 6 holds the ramp at 0 volts and is inverted and fed to the AND gate 305 to prevent the counter from overflowing and giving an erroneous output in case the analog input voltage exceeds its normal range.

The digital-to-analog converter 19 shown in FIG. 5 receives binary input signals 320 through 327 from the output signals of NAND gates 17. When a ONE signal 11 is applied to inverter 331, a ZERO signal is produced on line 333 which permits the outputs 350 through 357 of the flip-flops formed by NANDS 335 and 349 to assume a state which is the complement of the respective input signals 320 through 327. When input 11 returns to the ZERO state at the end of the $f_a$ pulse, line 333 becomes a ONE which permits the outputs 350 through 357 to be retained by the flip-flop memory action. The outputs 350 through 357 are either held at approximately 0 volts for a ZERO signal or clamped at approximately 5 volts for a ONE signal. These voltages act on a standard linear resistor decoding ladder to provide a current to the operational amplifier 359 which is proportional to the value of the binary number represented by signals 350 through 357. The output 21 of operational amplifier 359 is also proportional to the value of this binary number.

Figure 6:
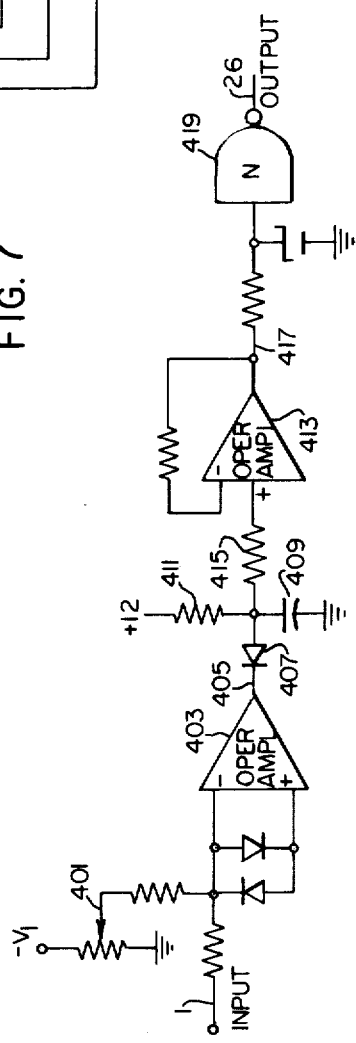
FIG. 6 is a schematic illustration of an abnormal condition detector circuit embodied in FIG. 1.

The abnormal condition detector of FIG. 6 compares the amplitude of analog input 1 to the reference threshold voltage 401 by means of operational amplifier 403 and its associated components. If analog input 1 exceeds a given positive threshold value, the output 405, which is normally positive, will become negative thereby changing capacitor 409 to a negative voltage by means of diode 407. Operational amplifier 413 is connected as a voltage follower and draws very little current through resistor 415. The voltgage on lead 417 is approximately equal to the voltage of capacitor 409 and becomes negative during an abnormal condition, i.e., when input 1 exceeds a given positive value. A negative signal on lead 417 produces a ONE output 26 from NAND 419 which causes pen recorder 23 to run and record the abnormal conditions. Signal 405 remains negative for as long as the abnormal condition persists. When the abnormal condition is removed signal 405 returns to its normal positive state and capacitor 49 charges slowly through resistor 411. Signal 26 remains in the ONE condition until the capacitor changes to a positive value thereby providing a pen recorder record for a predetermined time after the abnormal condition is removed.

Figure 7:
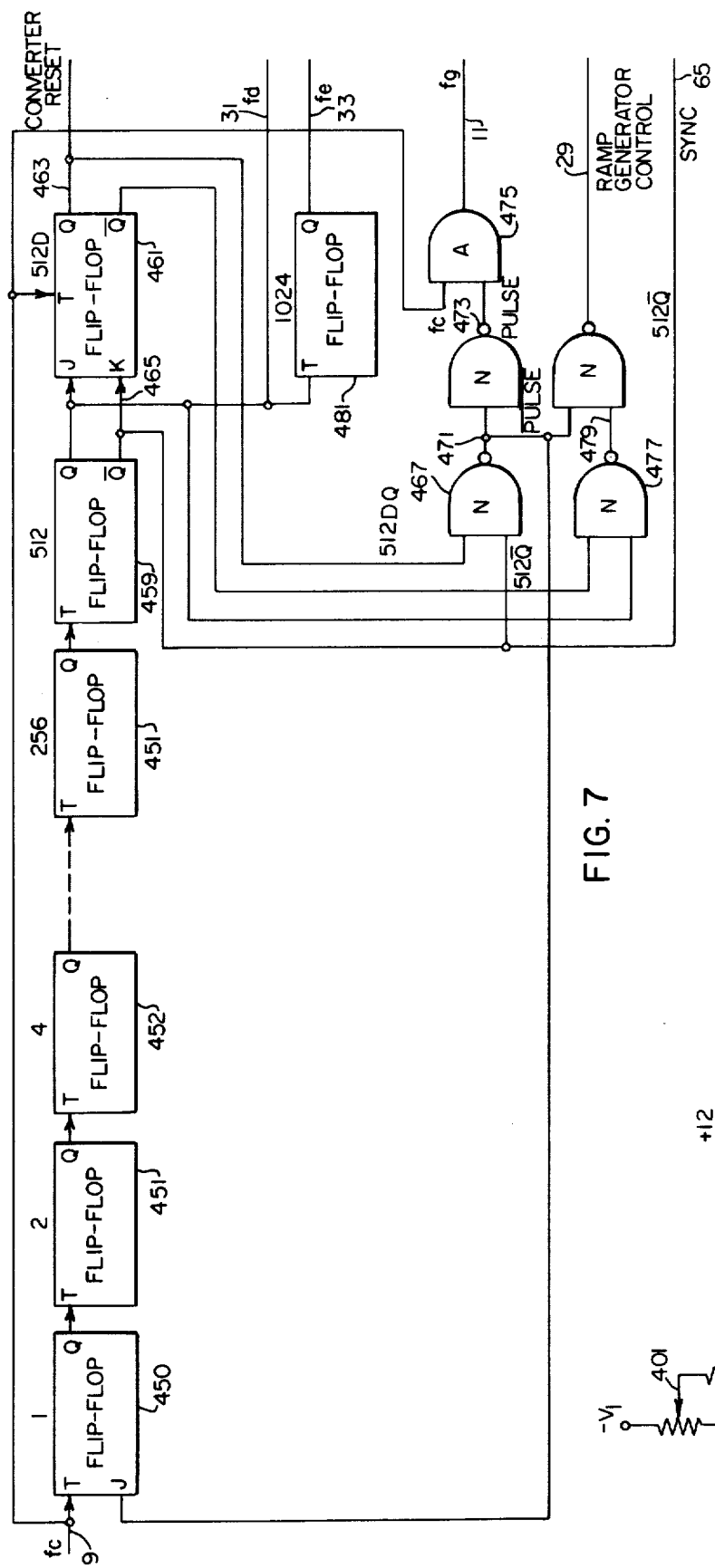
FIG. 7 is a schematic illustration of a frequency divider and control circuit embodied in FIG. 1.

The frequency divider and control circuit 15 shown in FIG. 7 contains ten ordinary JK flip-flop binary counter stages 450 through 459. Stage 450 is driven by clock signal 9. JK flip-flop stage 461 copies the previous state of stage 459 when a clock signal 9 is applied. Signals 463 and 465 act on NAND gate 467 to produce a ZERO output signal 471 only during count 1015. This ZERO signal 471 is fed back to the J input of stage 450 to prevent it from changing state during the next clock pulse 9. The next clock pulse causes signal 463 to become a ZERO which returns output 471 to its normal ONE state. During count 1025 the signal 473 is a ONE. AND gate 475 produces a ONE pulse during a portion of count 1024 as controlled by signals 9 and 473.

NAND gate 477 operates in a similar manner to NAND gate 467 to produce a ZERO output on lead 479 only during count 512. NAND gate 477 produces a ONE pulse on lead 29 during counts 512 and 1025. Signal 29 is used to control the ramp generator 39, which produces a 240 Hz triangular waveform. A square wave signal 31 is obtained from flip-flop 461 at frequency $f_d$, which is equal to 120 Hz while flip-flop 481 produces a square wave signal 33 at a frequency $f_e$ which is equal to 60 Hz, the repetition rates of the total four trace cathode-ray-tube display.

Figure 10B:
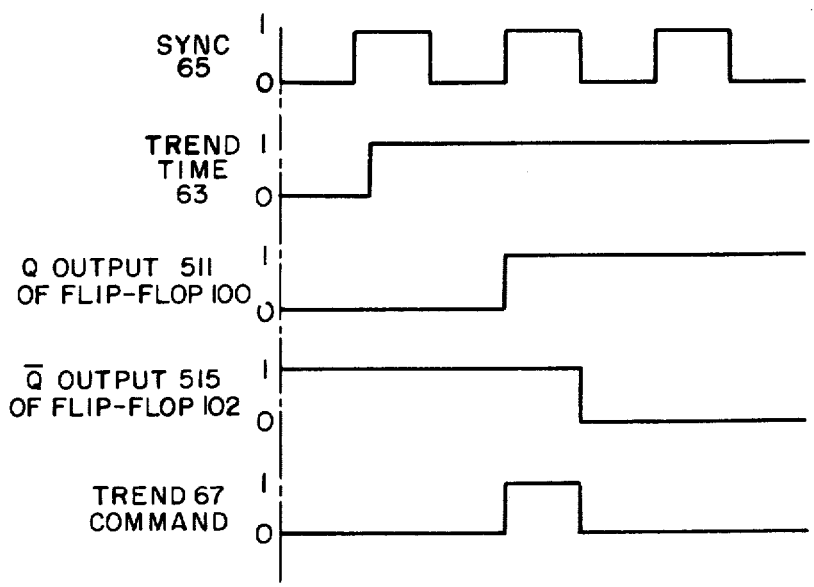

The trend control circuit 59 of FIG. 10a operates in conjunction with frequency divider 15 to provide an output trend command signal 67 which is timed correctly to permit the entry of one converted analog input trend sample into the shift registermemory and the advancement by one position of all the information in the shift register. The trend time input, which is unrelated in time to the signals of frequency divider 15, becomes a ONE when it is desired to take a single trend information sample. As shown in FIG. 10b the trend time input 63 is normally ZERO which keeps a ZERO signal applied to the J input of a standard J-K flip-flop 100 and by means of inverter 503 keeps a ONE signal 505 on the K input of flip-flop 100. The flip-flop 100 can change to a state permitted by the J and K inputs on any ONE to ZERO transistion of signal 507. Signal 507 is the complement of the 120 Hz square wave sync signal 65. With a ZERO input applied to the J input, the Q output 511 of flip-flop 100 remains in the ZERO state with the $\overline{Q}$ output 513 in the ONE state. Signals 511 and 513 cause the $\overline{Q}$ output 515 of JK flip-flop 102 to be in the ONE state. Signals 511 and 515 are applied to AND gate 517 and produce a TREND COMMAND signal which is normally a ZERO.

When the trend time signal 63 changes to a ONE state, a ONE signal is applied to the J input and a ZERO signal is applied to the K input of flip-flop 100. The next ZERO to ONE transition of the SYNC input 65, which is derived from the Q output 465 of flip-flop 459 of frequency divider 15, causes a ONE to ZERO transition of signal 507 which is applied to the toggle input of flip-flop 100. This transition in the presence of the ONE signal on the J input causes signal 511 to change to a ONE. Since the ZERO to ONE transition of signal 65 has no effect on flip-flop 102, signal 515 remains a ONE. Therefore a ONE output on lead 67 is produced by AND gate 517. On the next ONE to ZERO transition of signal 65, which is applied to the toggle input of flip-flop 102, flip-flop 102 changes state since a ONE signal 511 is applied to its J input. This causes signal 515 to become ZERO, which causes trend command signal 67 to become a ZERO. The trend command signal 67 is a ONE during exactly one full ONE period of the SYNC signal 65. This causes the desired sample to be taken into the shift register and the shift register bits to be advanced one location irrespective of the timing of the trend time signal 63.

I claim:

1. Apparatus for processing digital input signals, comprising, a shift register memory means adapted to sequentially receive input signals and store a predetermined number of said input signals as input signal information, clock means connected to said shift register memory means to advance said input signals through said shift register memory means causing the oldest stored input signal to be discarded in response to each new input signal received by said shift register memory means, logic control means, including means for selecting a first and second mode of operation, operatively connected to said shift register memory means to selectively gate said input signals to said shift register means at a first and second rate, and visual display means operatively connected to said shift register memory means to display the input signal information stored in said shift register memory means, the rate of introducing input signals to said shift register memory means in said first mode of operation producing a slowly moving display, said rate of introducing input signals to said shift register memory means in said second mode of operation being less than the rate corresponding to said first mode of operation and producing an essentially stationary display.

2. Apparatus for processing digital input signals as claimed in claim 1 including print record means operatively connected to said shift register memory means and responsive to a print command signal to provide a permanent record of the input signal information stored in said shift register memory means, and logic circuit means connected to said shift register memory means and responsive to said print command signal for causing the input signal information stored in said shift register memory means to be transferred from said shift register memory means to said print record means, and permitting input signals to be introduced into said shift register memory means when operating in said first mode of operation, and retaining the stored input signal information transferred to said print record means in said shift register memory means when operating in said second mode.

* * * * *